(12) United States Patent  (10) Patent No.: US 8,174,883 B2
Honma et al.  (45) Date of Patent: May 8, 2012

(54) SEMICONDUCTOR MEMORY DEVICE CAPABLE OF PREVENTING A SHIFT OF THRESHOLD VOLTAGE

(75) Inventors: Mitsuaki Honma, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 12/538,290

(22) Filed: Aug. 10, 2009

(65) Prior Publication Data

US 2010/0142271 A1    Jun. 10, 2010

(30) Foreign Application Priority Data

Dec. 5, 2008    (JP) .................................. 2008-311469

(51) Int. Cl.
*G11C 16/04* (2006.01)
(52) U.S. Cl. .......... 365/185.03; 365/185.22; 365/185.28
(58) Field of Classification Search ............. 365/185.03, 365/185.22, 185.28
See application file for complete search history.

(56) References Cited

U.S. PATENT DOCUMENTS

| 2009/0003054 A1* | 1/2009 | Hung et al. | 365/185.03 |
| 2009/0052243 A1* | 2/2009 | Park et al. | 365/185.03 |
| 2009/0213652 A1* | 8/2009 | Park et al. | 365/185.03 |
| 2010/0128524 A1* | 5/2010 | Hadas et al. | 365/185.03 |

FOREIGN PATENT DOCUMENTS

JP    2004-192789    7/2004

OTHER PUBLICATIONS

U.S. Appl. No. 13/038,928, filed Mar. 2, 2011, Namiki, et al.

* cited by examiner

*Primary Examiner* — Hoai V Ho
(74) *Attorney, Agent, or Firm* — Oblon, Spivak, McClelland, Maier & Neustadt, L.L.P.

(57) ABSTRACT

A memory cell array is connected to a word line and a bit line, and configured so that a plurality of memory cells storing one level of n levels (n is a natural number more than 4) in one memory cell are arrayed in a matrix. A control circuit controls a potential of the word line and the bit line in accordance with input data, and writs data in the memory cell. The control circuit applies a write voltage corresponding to write data to a memory cell. The write voltage differs for each write data. A verify operation is executed for each write data after a write voltage application operation ends with respect to all n levels.

20 Claims, 16 Drawing Sheets

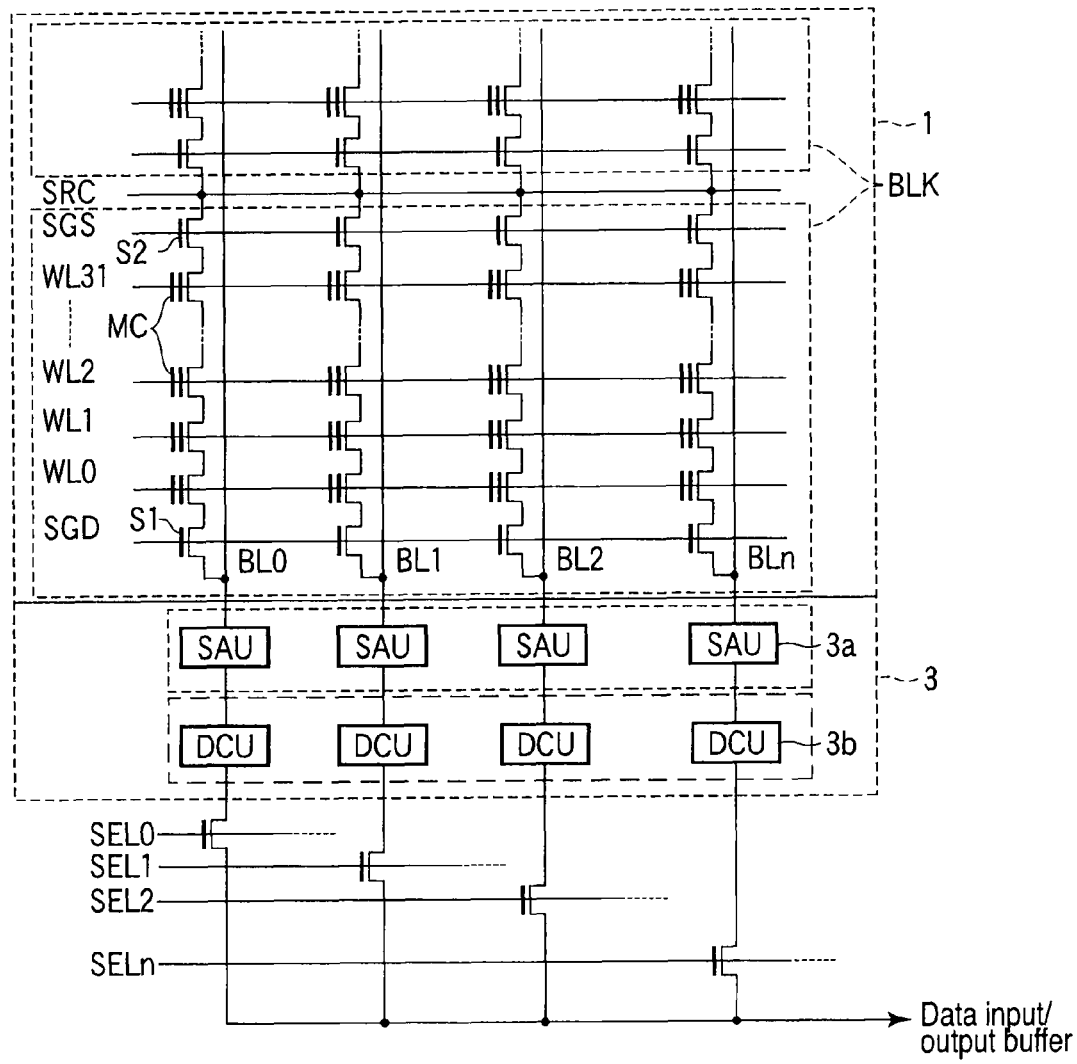
F I G. 2

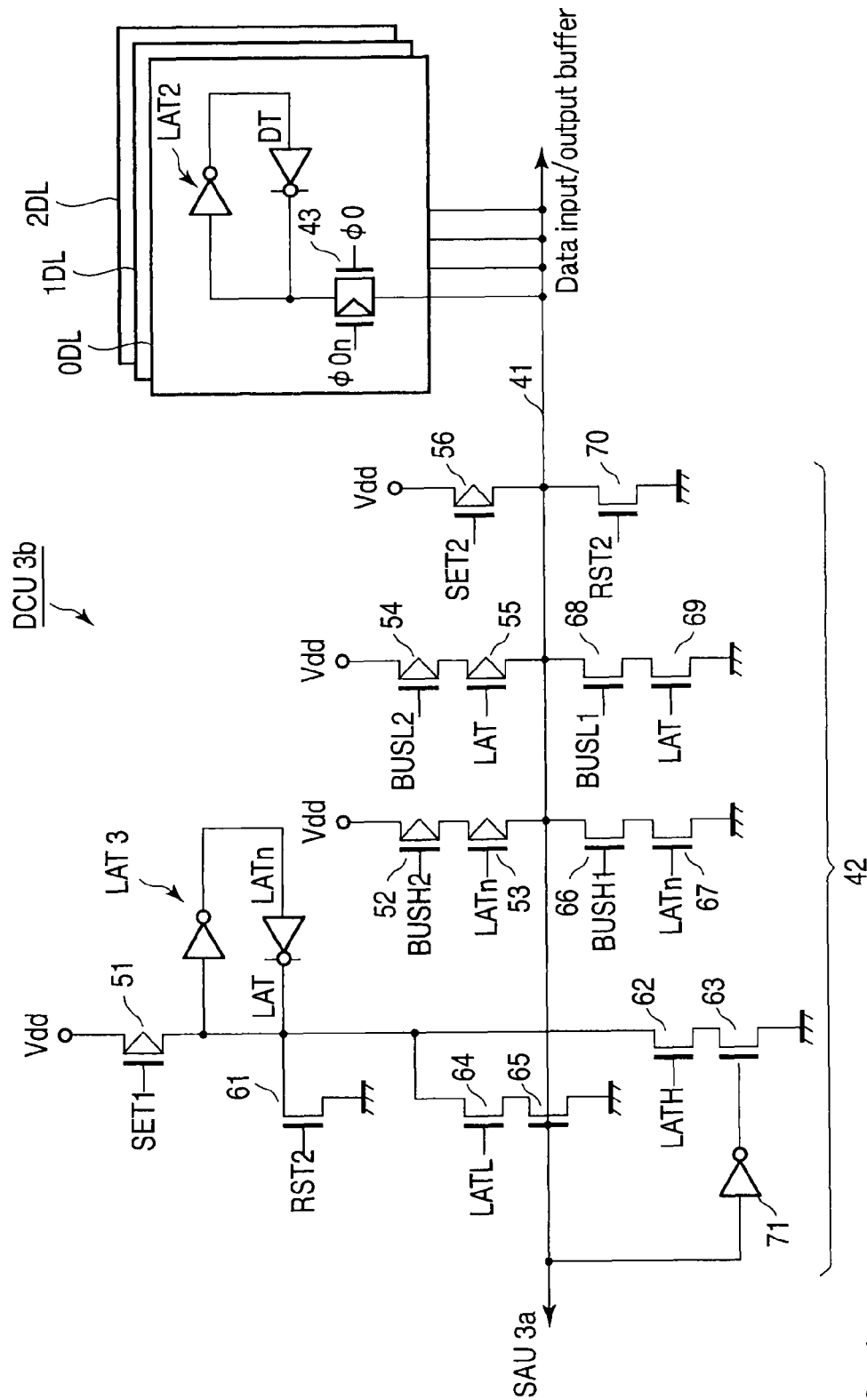
F I G. 4

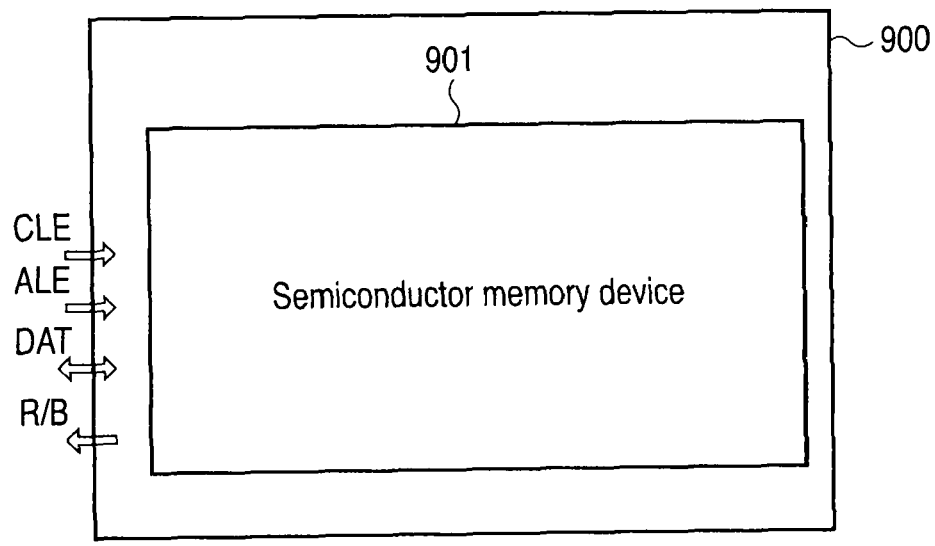
F I G. 12
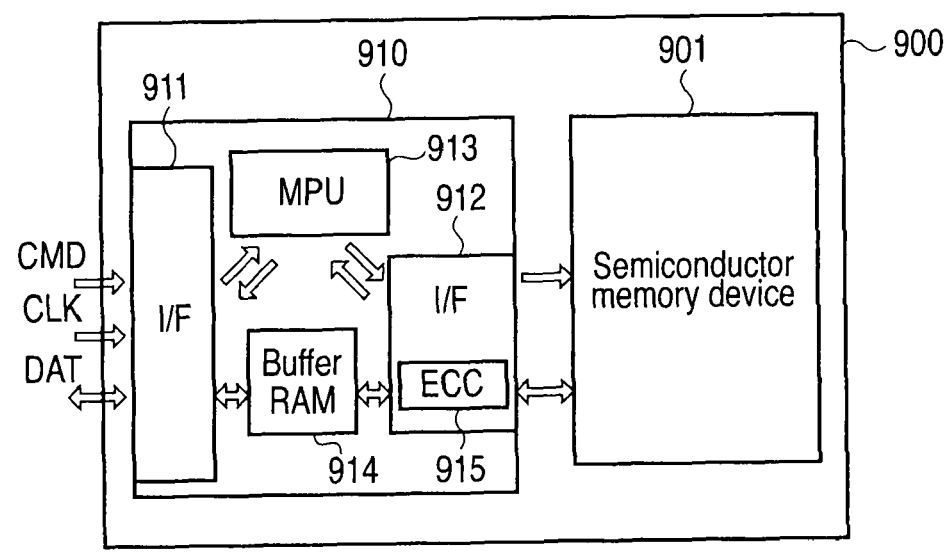
F I G. 13

SEMICONDUCTOR MEMORY DEVICE CAPABLE OF PREVENTING A SHIFT OF THRESHOLD VOLTAGE

CROSS-REFERENCE TO RELATED APPLICATIONS

This application is based upon and claims the benefit of priority from prior Japanese Patent Application No. 2008-311469, filed Dec. 5, 2008, the entire contents of which are incorporated herein by reference.

BACKGROUND OF THE INVENTION

1. Field of the Invention

The present invention relates to a NAND flash memory. In particular, the present invention relates to a semiconductor memory device capable of storing multi-level data.

2. Description of the Related Art

A NAND flash memory is configured so that a write or read operation is collectively performed with respect to a plurality of cells arrayed in the row direction. Recently, a multi-level memory storing multi-bit data in one memory cell has been developed. For example, if four threshold (voltage) levels are set, one cell is storable with two-bit data. If eight threshold levels are set, one cell is storable with three-bit data. Further, if 16 threshold levels are set, one cell is storable with four-bit data.

Scale reduction of the cell greatly advances; as a result, there is a tendency for capacitance coupling between neighboring cells to increase. For this reason, there is a problem that the threshold level of the previously written cell changes due to a write operation of the neighboring cell. In a NAND flash memory, data is written from a memory cell on the side of a source line. For this reason, a memory cell on the side of a bit line is written, and thereby, the threshold voltage of the previously written memory cell shifts. Therefore, a write method of preventing a shift of threshold voltage due to capacitance coupling has been developed (e.g., see Jpn. Pat. Appln. KOKAI Publication No. 2004-192789).

The shift of the threshold voltage by capacitance coupling with neighboring cell is generated between a plurality of memory cells connected to one word line. Specifically, if multi-level data is written, write is completed from a memory cell having a low threshold voltage. For this reason, the following problem arises. Namely, a high threshold voltage is written to a memory cell adjacent to the memory cell written with a low threshold voltage. In this case, the threshold voltage of the previously written memory cell of low threshold voltage shifts to a higher threshold voltage due to capacitance coupling with a memory cell written to a high threshold voltage. For this reason, the distribution width of the low threshold voltage widens, and thus, the potential difference between high threshold voltage and low threshold voltage becomes narrow. If the potential difference between threshold voltage distributions becomes narrow, the read margin is reduced, and further, the possibility of a read error being generated becomes high. Therefore, it is desired to provide a semiconductor memory device capable of preventing a shift of threshold voltage due to capacitance coupling with neighboring cells.

BRIEF SUMMARY OF THE INVENTION

According to a first aspect of the invention, there is provided a semiconductor memory device comprising: a memory cell array connected to a word line and a bit line, and configured so that a plurality of memory cells storing one level of n levels (n is a natural number more than 4) in one memory cell are arrayed in a matrix; and a control circuit configured to control a potential of the word line and the bit line in accordance with input data, and writing data in the memory cell, wherein the control circuit performs a operation which applies a write voltage corresponding to data written to the memory cell, for every write data, and wherein the control circuit executes a verify operation for each write data after a write voltage application operation ends with respect to all n levels or to data of a predetermined unit.

According to a second aspect of the invention, there is provided a write method used for a semiconductor memory device, comprising: applying a write voltage corresponding to write data to a memory cell using a control circuit, the write voltage being different for each write data; and executing a verify operation for each write data after write voltage application ends with respect to all n levels (n is a natural number more than 4).

BRIEF DESCRIPTION OF THE SEVERAL VIEWS OF THE DRAWING

FIG. 2 is a block diagram showing each configuration of a memory cell array and a sense amplifier circuit;

FIG. 4 is a circuit diagram showing the configuration of a data control unit;

FIG. 12 is a view showing the configuration of an application to which a semiconductor memory device according to this embodiment is applied;

FIGS. 13 to 21 are views showing the configuration of other applications; and

DETAILED DESCRIPTION OF THE INVENTION

Various embodiments of the present invention will be hereinafter described with reference to the accompanying drawings.

Figure 1:
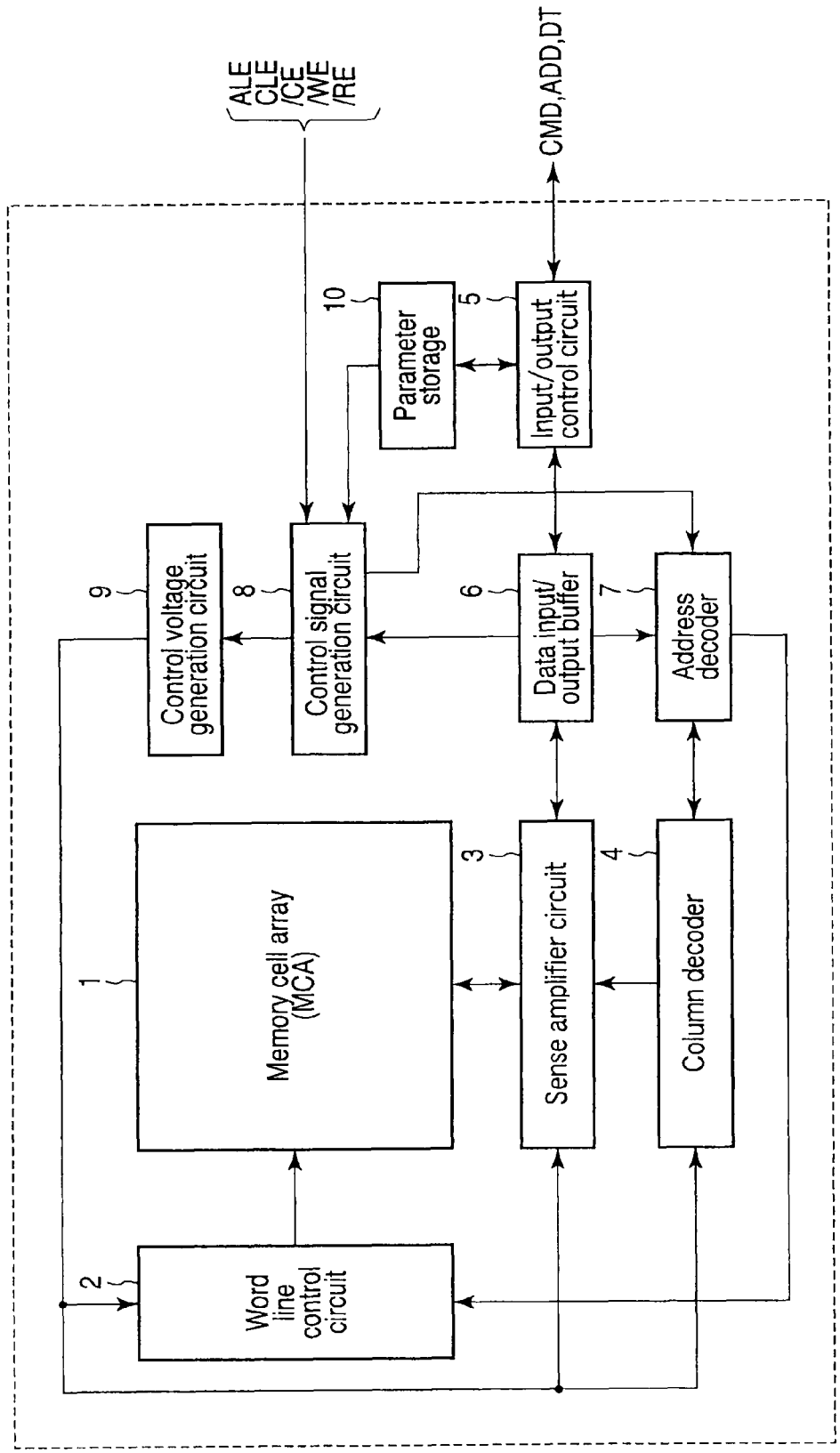
FIG. 1 is a block diagram schematically showing the configuration of a semiconductor memory device to which the present invention is applied.

FIG. 1 schematically shows the configuration of a semiconductor memory device according to an embodiment of the present invention.

In FIG. 1, a memory cell array 1 comprises a NAND flash memory, which is capable of storing two-bit data in one memory cell. Specifically, the memory cell array 1 includes a plurality of bit lines, a plurality of word lines, a common source line and a plurality of memory cells. For example, each memory cell comprises electrically data rewritable EEPROM cells arrayed in the row and column directions. A word line control circuit 2 functioning as a row decoder is connected to a word line of the memory cell array 1 to select and drive a word line. A sense amplifier circuit 3 is connected to a bit line of the memory cell array 1. Further, the sense amplifier circuit 3 has data read and write functions and a function of converting write data to the number of remaining write times, as described later. A column decoder 4 outputs a column select signal for selecting a bit line of the memory cell array in accordance with an output signal from an address decoder 7.

An input/output control circuit 5 receives externally supplied various commands, address signal and write data. In a data write operation, write data is supplied from the input/output control circuit 5 to the sense amplifier circuit 3 via a data input/output buffer 6. In a data read operation, data read by the sense amplifier circuit 3 is supplied to the input/output control circuit 5 via the data input/output buffer 6, and then, output externally from the input/output control circuit 5.

An address signal supplied from the input/output control circuit to the data input/output buffer 6 is supplied to the address decoder. A signal decoded by the address decoder 7 is supplied to the word line control circuit 2 and the column decoder 4.

A command supplied from the input/output control circuit 5 to the data input/output buffer 6 is supplied to a control signal generation circuit 8. The control signal generation circuit 8 is externally supplied with the following external control signals. The signals include a chip enable signal /CE, a write enable signal /WE, a read enable signal /RE, an address latch enable signal ALE and a command latch enable signal CLE. The circuit 8 generates the following control signals based on external control signals and commands supplied in accordance with an operation mode. One is a control signal for controlling a data write and erase sequence, and the other is a control signal for controlling data read. The control signal is supplied to a control voltage generation circuit 9 and the address decoder 7.

The control voltage generation circuit 9 generates voltages required for various operations of the memory cell array, the sense amplifier circuit 3 and the column decoder 4 in accordance with various control signals supplied from the control signal generation circuit 8. The voltages include a read voltage, write voltage, verify voltage and erase voltage.

A parameter storage 10 is connected to the input/output control circuit 5 and the control signal generation circuit 8. The parameter storage 10 stores parameters suitable for a chip quality determined in a test process.

FIG. 2 shows each configuration of the memory cell array 1 and the sense amplifier circuit 3 shown in FIG. 1. The memory cell array 1 includes a plurality of blocks BLK shown by the broken line. These blocks form an erase unit. Each block BLK has a plurality of NAND cells arrayed. One NAND cell is composed of a memory cell MC comprising series-connected 32 EEPROMs, select gate transistors S1 and S2. The select gate transistor S1 is connected to a bit line BL0 while the select gate transistor S2 is connected to a source line SRC. Control gates of memory cells MC arrayed in each row are connected in common to word lines WL0, WL1, WL2 to WL31. The select gate transistor S1 is connected in common to a select line SGD while the select gate transistor S2 is connected in common to a select line SGS.

The sense amplifier circuit 3 has a plurality of sense amplifier units (SAU) 3a and a plurality of data control units (DCU) 3b. Each sense amplifier unit 3a is connected to bit lines BL0, Bl1, BL2 to BLn. Each data control unit 3b is connected to each sense amplifier unit 3a. Each sense amplifier unit 3a detects data read from the memory cell to the bit line, and then, holds the data in a data read operation. Each data control unit 3b is connected to the data input/output buffer via transistors operated according to column select signals SEL0 to SELn.

In a write operation (also called a program operation) a read operation and a program verify operation (also called a verify operation), the bit line connected to the sense amplifier unit 3a is selected while one word line is selected. A write or read voltage is applied to all memory cells connected to the selected word line, and thereby, a write or read operation is simultaneously carried out.

The data control unit 3b holds write data supplied externally, and also, holds data read from the sense amplifier unit 3a. Further, the unit 3b converts the write data in accordance with a data state in a data write operation.

In FIG. 2, the sense amplifier unit 3a is connected to each bit line. However, this embodiment is not limited to the foregoing configuration, and for example, one unit may be provided with respect to two bit lines. Moreover, the data control circuit 3b is connected to each sense amplifier unit 3a. However, this embodiment is not limited to the foregoing configuration. For example, the following configuration may be employed. Specifically, one data control circuit 3b is provided with respect to eight sense amplifier units, and selectively connected to the sense amplifier unit 3a.

Figure 3:
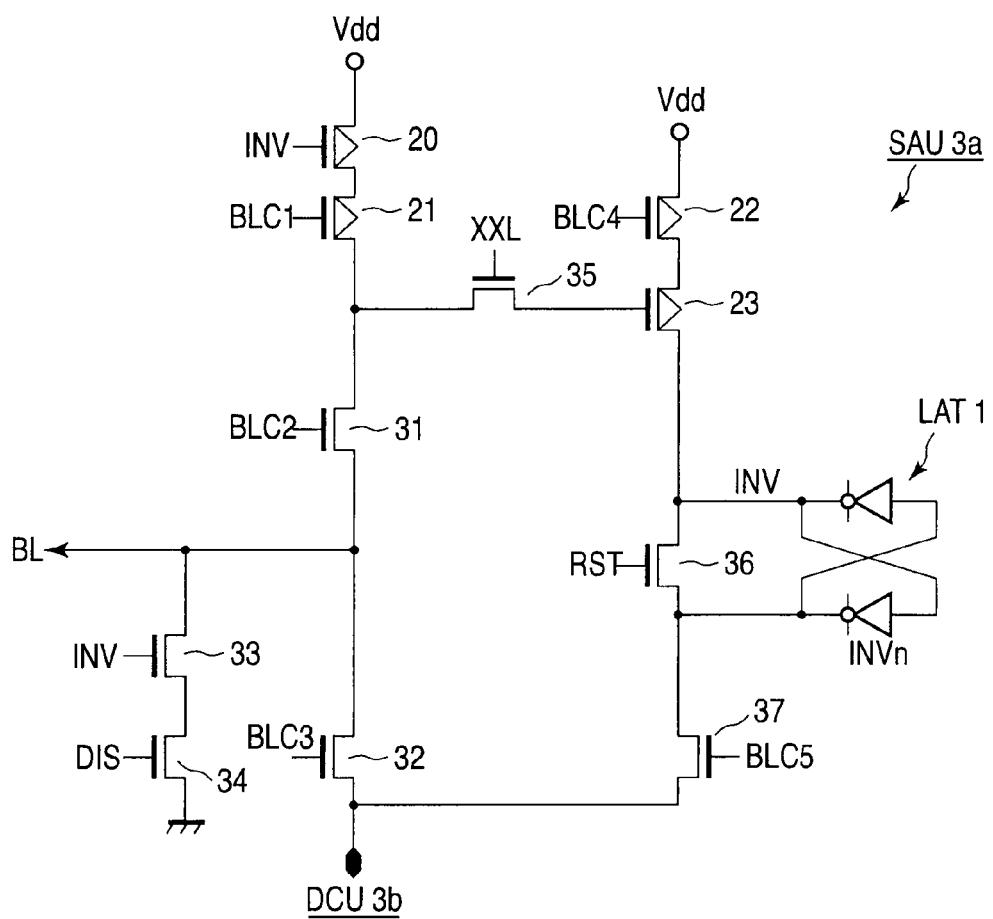
FIG. 3 is a circuit diagram showing the configuration of a sense amplifier unit.

FIG. 3 shows the configuration of the sense amplifier unit (SAU) 3a. The sense amplifier unit 3a is composed of several P-channel MOS transistors (hereinafter, referred to as PMOS) 20, 21, 22, 23, several N-channel MOS transistors (hereinafter, referred to as NMOS) 31, 32, 33, 34, 35, 36, 37 and a latch circuit LAT1. For example, these PMOS and NMOS transistors comprise a clocked inverter circuit.

The source of the PMOS 20 is connected to a node supplied with power supply voltage Vdd, and the drain thereof is connected to the data control unit (DCU) 3b via PMOS 21, NMOSs 31 and 32. The gate of the PMOS 20 is connected to a node INV of the latch circuit LAT1 described later. The gate of the PMOS 21 is supplied with a signal BLC1 while gates of NMOSs 31 and 32 are supplied with signals BLC2 and BLC3, respectively. A connection node of NMOSs 31 and 32 is connected to a bit line BL, and grounded via NMOSs 33 and 34. The gate of the NMOS 33 is connected to the node INV of the latch circuit LAT1 so that the NMOS 33 is controlled according to data held in the latch circuit LAT1. The gate of the NMOS 34 is supplied with a signal DIS.

The source of the PMOS 22 is connected to a node supplied with power supply voltage Vdd, and the drain thereof is connected to the data control unit 3b via PMOS 23, NMOSs 36 and 37. The gate of the PMOS 22 is supplied with a signal BLC4 while the gate of the PMOS 23 is connected to a connection node of PMOS 21 and NMOS 31 via the NMOS 35. The gate of the NMOS 35 is supplied with a signal XXL while the gate of the NMOS 36 is supplied with a reset signal RST. The gate of the NMOS 37 is supplied with a signal BLC5. The latch circuit LAT1 is connected in parallel with the NMOS 36.

The operation of the foregoing sense amplifier unit will be described below.

(Write Operation)

When data is written to a memory cell, the reset signal RST is once set to a high level (hereinafter, referred to as H level) so that the latch circuit LAT1 is reset. In other words, the node INV of the latch circuit LAT1 is set to an L level. Thereafter, signals BLC1, BLC4 and DIS are set to a low level (hereinafter, referred to as the L level).

Thereafter, signals BLC2, BLC3 and XXL are set to an H level, and the signal BLC4 is set to an L level, and thus, data is captured from the data control unit 3b. If the data is L level "0" showing write, the gate of the PMOS 23 attains the L level, and thus, the PMOS 23 turns on. Therefore, H level "1" is set for the latch circuit LAT1. Conversely, if the data is H level "1" showing non-write, the PMOS 23 turns off. Therefore, L level "0" is set for the latch circuit LAT1. In brief, the node INV of the latch circuit LAT1 is set to the H level when data is written, while being set to the L level in a non-write operation.

Then, signals BLC1, BLC3, DIS and XXL are set to the L level while the signal BLC2 is set to the H level, and thus, the bit line BL is charged to the H level. Thereafter, the signal DIS is set to the H level. In this case, if the node INV of the latch circuit LAT1 is at the H level, showing write, the NMOS 33 turns on so that charges of the bit line are discharged via NMOSs 33 and 34. Conversely, if the node INV of the latch circuit LAT1 is at the L level, showing non-write, the NMOS 33 turns off; therefore, the potential of the bit line is held at the H level. Thereafter, the select line SGD of the select gate transistor S1 connecting the bit line shown in FIG. 2 and the NAND cell is set to the H level, and thereby, the potential of the bit line is transferred to a channel of the memory cell. Simultaneously, write voltage Vpgm is applied to a word line of the selected memory cell. Therefore, in a write cell, the channel is set to the L level (Vss), and the word line is set to write voltage Vpgm, and thus, write is performed. In non-write, the channel is set to the H level (Vdd-Vth: Vth is the threshold voltage of a select gate transistor), and the word line is set to Vpgm, and thus, write is not performed.

(Read Operation)

When data is read from a memory cell, the reset signal RST is once set to the H level so that the latch circuit LAT1 is reset. Thereafter, signals BLC1, BLC3, DIS and XXL are set to the L level, and the signal BLC2 is set to the H level, and thus, the bit line is charged to the H level. Thereafter, the signal BLC2 is set to the L level so that the read level voltage is supplied to a select word line. If the threshold voltage of a memory cell is higher than the read level, the memory cell is in an off state, and the bit line is held at the H level. Conversely, if the threshold voltage of a memory cell is lower than the read level, the memory cell is in an on state, and charges of the bit line are discharged. Therefore, the bit line attains the L level. Then, the signal BLC3 is set to the H level so that the potential of the bit line is read to the data control unit 3b.

(Program Verify Operation)

After a write operation, a program verify operation of verifying the threshold voltage of a memory cell is substantially the same as the read operation. In this case, the bit line is charged to the H level, and thereafter, a predetermined verify voltage is applied to a select word line. If the threshold voltage of a memory cell reaches the verify voltage, the memory cell is in an off state. Therefore, the potential of the bit line is held at the H level. Conversely, if the threshold voltage of a memory cell does not reach the verify voltage, the memory cell is in an on state. Therefore, the potential of the bit line attains the L level.

In this state, signals BLC1, BLC2 and XXL are set to the H level while signals BLC4, BLC3, DIS and RST are set to the L level, and thus, the potential of the bit line BL is held in the latch circuit LAT1. Specifically, when the threshold voltage of the memory cell reaches the verify voltage and the potential of the bit line BL is at the H level, the PMOS 23 turns off. Therefore, the latch circuit LAT1 is held at the L level. When the threshold voltage of the memory cell does not reach the verify voltage and the potential of the bit line BL is at the L level, the PMOS 23 turns on. Therefore, the latch circuit LAT1 is held at the H level. Namely, if the verify operation is passed, the potential of the node INV of the latch circuit LAT1 is set to the L level. If the verify operation is not passed, the potential of the node is set to the H level.

Data of an inverted node INVn of the latch circuit LAT1 sets the signal BLC to the H level, and in a state that the NMOS 37 turns on, the data is transferred to the data control unit 3b.

FIG. 4 shows the configuration of a data control unit (DCU) 3b. The data control unit 3b includes three data latch circuits; 0DL, 1DL and 2DL given as a data cache, a bus 41 and a data formation circuit 42.

One terminal of the bus 41 is connected to the sense amplifier unit 3a, and the other terminal thereof is connected to a data input/output buffer.

The data latch circuit 0DL is composed of a latch circuit LAT2 and a transfer gate 43. The latch circuit LAT2 is connected to the bus 41 via the transfer gate 43. The transfer gate 43 is controlled according to a signal Φ and an inverted signal Φn. Data latch circuits 1DL and 2DL each have the same configuration as the data latch circuit 0DL, and a signal supplied to each transfer gate is different. Therefore, data latch circuits 0DL, 1DL and 2DL are selectively connectable to the bus 41.

The data formation circuit 42 is composed of a latch circuit LAT3, PMOSs 52 to 56, NMOSs 61 to 70 and an inverter circuit 71. The source of the PMOS 51 is connected to a node supplied with power supply voltage VDD. The gate of the PMOS 51 is supplied with a set signal SET1 while the drain thereof is connected to the latch circuit LAT3. The drain of the PMOS 51 is further grounded via the NMOS 61, and grounded via NMOSs 62 and 63. The gate of the NMOS 61 is supplied with a reset signal RST2 while the gate of the NMOS 62 is supplied with a signal LATH. The gate of the NMOS 63 is connected to an output terminal of the inverter circuit 71 having an input terminal connected to the bus 41. The drain of the PMOS 51 is grounded via NMOSs 64 and 65. The gate of the NMOS 64 is supplied with a signal LATL, and the gate of the NMOS 65 is connected to the bus 41.

A serial circuit of PMOSs 52 and 53, a serial circuit of PMOSs 54 and 55 and the PMOS 56 are connected between a node supplied with power supply voltage Vdd and the bus 41.

The gate of the PMOS 52 is supplied with a signal BUSH2, and the gate of the PMOS 53 is connected to a node LATn of the LAT3. PMOSs 52 and 53 are a circuit, charges the bus 41 to H level in accordance with the signal BUSH2 and potential of the node LATn of the LAT3.

The gate of the PMOS 54 is supplied with a signal BUSL2, and the gate of the PMOS 55 is connected to a node LAT of the LAT3. PMOSs 54 and 55 are a circuit, which charges the bus 41 to the H level in accordance with the signal BUSL2 and potential of the node LAT of the LAT3.

The gate of the PMOS 56 is supplied with a set signal SET2. The PMOS 56 is a circuit which charges the bus 41 to the H level in accordance with the set signal SET2.

A serial circuit of NMOSs 66 and 67, a serial circuit of NMOSs 68 and 69 and the NMOS 70 are connected between the bus 41 and ground.

The gate of the NMOS 66 is supplied with a signal BUSH1, and the gate of the NMOS 67 is connected to a node LATn of the LAT3. NMOSs 66 and 67 form a circuit for discharging the bus 41 to the L level in accordance with the signal BUSH1 and the potential of the node LATn of the LAT3.

The gate of the NMOS 68 is supplied with a signal BUSL1, and the gate of the NMOS 69 is connected to a node LAT of the LAT3. NMOSs 68 and 69 form a circuit for discharging the bus 41 to the L level in accordance with the signal BUSL1 and the potential of the node LAT of the LAT3.

The gate of the NMOS 70 is supplied with a reset signal RST2. The NMOS 70 is a circuit for discharging the bus 41 to the L level in accordance with the reset signal RST2.

The data control unit 3b holds data in data latch circuits 0DL, 1DL and 2DL, and can process the held data. Specifically, the data control unit 3b can perform the following operations, for example, logical product "AND", "NAND", logical sum "OR" and inversion of the held data, as described later.

(Basic Operation of Data Control Unit)

The basic operation of the foregoing data control unit will be described below. Two-bit write data supplied from the data input/output buffer 6 are latched in data latch circuits 1DL and 2DL one-bit by one-bit. For example, data latch circuits 1DL and 2DL hold lower page data and upper page data, respectively. The data latch circuit 0DL is used for holding flag data showing that verify is passed. Data of data latch circuits 0DL, 1DL and 2DL are transferred to the bus 41 via the transfer gate 43.

When the LAT3 captures data of the bus 41, the reset signal RST2 is set to the H level to turn on NMOSs 61 and 70, and further, the bus 41 and the latch circuit LAT3 is reset to the L level.

Then, the set signal SET1 is set to the L level to turn on the PMOS 51, and the latch circuit LAT3 is set to the H level. When the latch circuit LAT3 captures data, the latch circuit LAT3 is first set to the H level. Thereafter, data is transferred to the bus 41 by any of data latch circuits 0DL to 2DL. In this state, a signal LATH is set to the H level. If data of the bus 41 is at the H level, an output signal of the inverter circuit 71 attains the low level, and thus, the NMOS 63 is intactly in an off state. Therefore, the latch circuit LAT3 is intactly at the H level.

Conversely, if data of the bus 41 is at the L level, the output signal of the inverter circuit 71 attains the H level, and thus, the NMOS 63 turns on. Therefore, the latch circuit LAT3 is discharged via NMOSs 62 and 63, and then, attains the L level.

The operation of inverting data of the bus 41 to capture it in the latch circuit LAT3 will be described below. In a state that the latch circuit LAT3 is set to the H level in the manner described above, data is transferred to the bus 41. Thereafter, a signal LATL is set to the H level. If data of the bus 41 is at the H level, the NMOS 65 turns on. Therefore, the latch circuit LAT3 is discharged via NMOSs 64 and 65, and then, attains the L level.

Moreover, if the bus 41 is the L level, the NMOS 65 is intactly in an off state. Therefore, the latch circuit LAT3 is intactly at the H level.

In this manner, data held in the latch circuit LAT3 is transferred to data latch circuits 0DL to 2DL, and thereby, data of data latch circuits 0DL to 2DL are controlled.

(Inversion Operation of Data Stored in Data Latch Circuit)

The inversion operation of inverting data of data latch circuits 0DL to 2DL will be described below. First, the bus 41 is charged according to the foregoing operation so that the transfer gate 43 of any of data latch circuits 0DL to 2DL is opened. For example, the transfer gate 43 of the data latch circuit 0DL is opened. In this case, if the node DT of the data latch circuit 0DL is at the H level, the bus 41 is discharged via the clocked inverter circuit of the data latch circuit 0DL, and inverted data of the node DT is transferred to the bus 41.

Then, after the LAT3 is reset, signal SET1 is set in the L level and the node LAT of LAT3 is set to the H level.

In the state that signal LATL is set to the H level, when the bus 41 is discharged by data of the data latch circuit, the node LAT stays at the H level, and when the bus 41 stays in a charged state, and thereby, the NMOS 65 turns on. Therefore, the node LAT is discharged to the L level.

As described above, the bus 41 is charged so that the signal BUSH1 is set to the H level. If the node LAT is at the H level (node LATn is L level), the bus 41 stays at the H level. If the node LAT is at the L level (node LATn is H level), the bus 41 becomes L level.

Finally, the latch circuit LAT2 of the data latch circuit 0DL is reset, and thereafter, the transfer gate 43 is opened, and thereby, data of the bus 41 is captured in the latch circuit LAT2 via the transfer gate 43. As a result, if data of the bus 41 is at the H level, the node DT attains the L level, and conversely, if data of the bus 41 is at the L level, the node DT attains the H level.

According to the operation, inverted data of the node DT of the latch circuit LTA2 is transferred to the bus 41, and then, the inverted data is transferred to the latch circuit LTA1. Data of the latch circuit LAT1 is transferred to the bus 41, and the inverted data of the bus 41 is held in the latch circuit LTA2. In this manner, each node DT of data latch circuits 0DL to 2DL is inverted.

The basic operation of the data control unit 3b is not limited to the foregoing operation, and is performed according to other operations. It is possible to carry out "AND", "NAND" and "OR" operations of data using the forgoing operation as a base.

(Write Operation)

Figure 5:
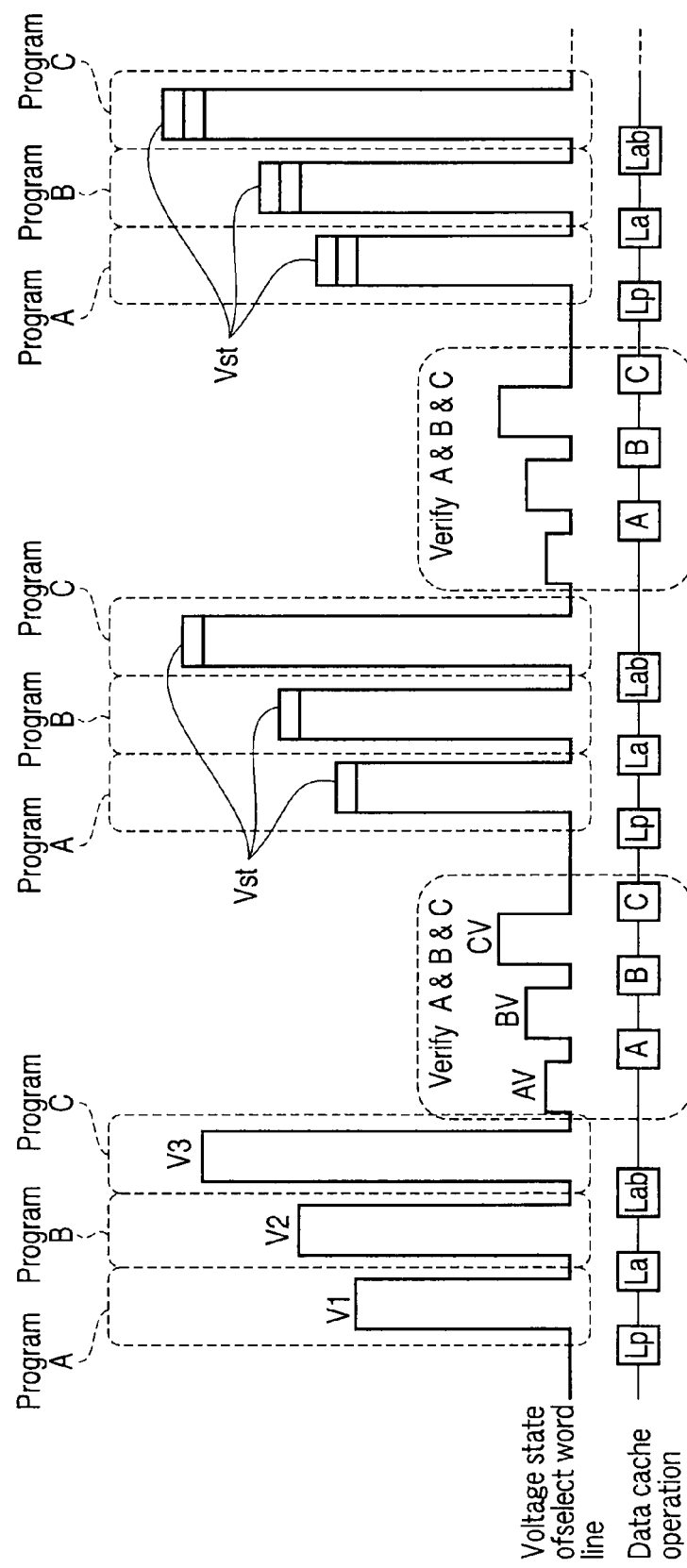
FIG. 5 is a view to explain a write operation according to a first embodiment.
Figure 6:
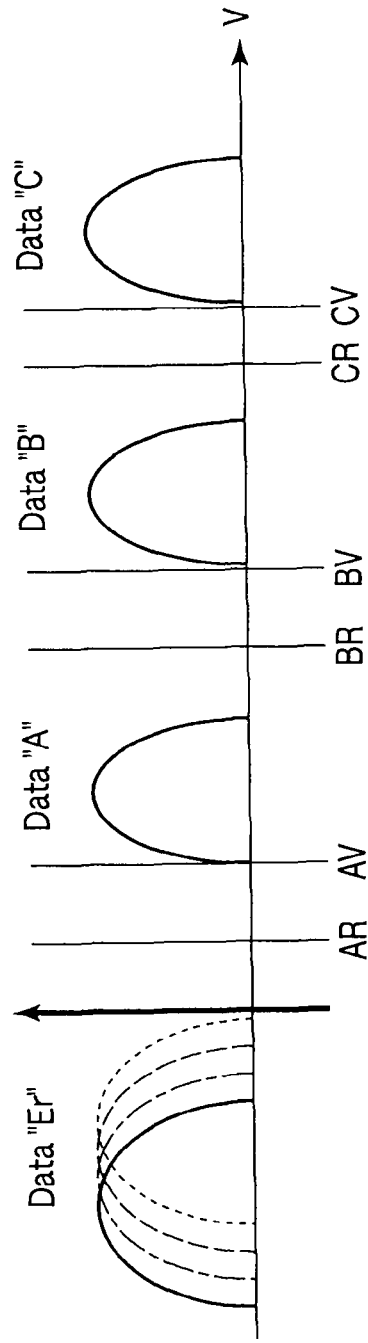
FIG. 6 is a view showing a threshold voltage distribution according to the write operation of the first embodiment.

FIG. 5 shows a write operation according to a first embodiment. FIG. 6 shows a threshold voltage distribution obtained by the write operation shown in FIG. 5. A data write operation will be described with reference to FIGS. 5 and 6.

The first embodiment relates to the case where four-level two-bit data is written, for example. As shown in FIG. 6, when write data is set as "Er", "A", "B" and "C", the relationship of the threshold voltage corresponding to these write data is set to "Er"<"A"<"B"<"C". The threshold level of a memory cell after erase is set to data "Er", for example, a negative level, and set to a positive level according to data "A", "B" and "C". The input write data are held in data latch circuits 0DL and 1DL. Data "Er", "A", "B" and "C" are held in data latch circuits 0DL and 1DL in the following manner.

Data "Er": (0DL, 1DL)=(1, 1)
Data "A": (0DL, 1DL)=(1, 0)
Data "B": (0DL, 1DL)=(0, 1)
Data "C": (0DL, 1DL)=(0, 0)

(Write Operation)

According to the write operation shown in FIG. 5, the data control unit 3b produces a non-write state with respect to non-write data "Er" in a period Lp. In this case, an AND operation of data of data latch circuits 0DL and 1DL is performed, and then, the result is transferred to the latch circuit LAT1 of the sense amplifier unit 3a. An AND operation is executed by simultaneously reading data of data latch circuits 0DL and 1DL to the bus 41. As a result, the bus 41 is held at the H level only when the write data is non-write data "Er", and is put in the L level for other write data. The foregoing level of the bus 41 is held in the latch circuit LAT1 of the sense amplifier unit 3a. As a result, when the write data is non-write data "Er", the node INV is set to "0", and when the write data is other data, the node INV is set to "1".

Thereafter, according a program A shown in FIG. 5, one word line is selected, and then, a first write voltage V1 is applied to the selected word line (WL). Specifically, the first write voltage V1 is applied to a memory cell writing data "A", "B" and "C", and thus, a write operation is executed. The first write voltage V1 is a voltage such that for example, data "A" write is completed.

In a period La shown in FIG. 5, the data control unit 3b sets non-write data "Er" and data "A" to a non-write state. In this case, data of the data latch circuit 0DL is read to the bus 41 to make a non-write state of non-write data "Er" and data "A", and then, the level is intactly transferred to the latch circuit LAT1. As a result, according to the case of non-write data "Er" and data "A", the following state is produced; specifically, the node INV of the sense amplifier unit 3a is set to "0", and the node INV of data "B" and "C" is set to "1".

Thereafter, in a program B shown in FIG. 5, a second write voltage V2 is applied to a select word line. Specifically, the second write voltage V2 is applied to a memory cell in which data "B" and "C" are written, and thus, a write operation is executed. The second write voltage V2 is a voltage slightly higher than the first write voltage, that is, a voltage such that data "B" write is completed.

In a period Lab shown in FIG. 5, the data control unit 3b sets non-write data "Er" ad write data "A" and "B" to a non-write state. In this case, an OR operation of data of data latch circuits 0DL and 1DL is executed, and then, the result is set to the latch circuit LAT1 of the sense amplifier circuit 3a.

Thereafter, in a program C period shown in FIG. 5, a third write voltage V3 is applied to a select word line. Specifically, the third write voltage V3 is applied to a memory cell only in which data "C" is written, and thus, a write operation is executed. The third write voltage V3 is a voltage higher than the second write voltage V2, that is, a voltage such that write of data "C" is completed.

As described above, each write corresponding to data "A", "B" and "C" is executed, and thereafter, a verify operation is executed with respect to data "A", "B" and "C". The verify operation is the same as the foregoing read operation, and therefore, a voltage as a verify level supplied to a word line is different. Data read levels are voltages "AR", "BR" and "CR" between threshold voltage distributions corresponding to each of data "A", "B" and "C". However, the verify levels are voltages "AV", "BV" and "CV" slightly higher than the foregoing voltages. The verify levels "AV", "BV" and "CV" are successively supplied to a select word line, and thus, the threshold voltage of a memory cell is verified.

First, the verify level "AV" is supplied to the select word line to execute a verify operation. As a result, a memory cell completing the verify operation is set to a non-write state. Specifically, in the period A shown in FIG. 5, data latch circuits 0DL and 1DL corresponding to write data "A" of the memory cell are set to "11".

Then, the verify level "BV" is supplied to the select word line to execute a verify operation. As a result, a memory cell completing the verify operation is set to a non-write state. Specifically, in the period B shown in FIG. 5, data latch circuits 0DL and 1DL corresponding to write data "B" of the memory cell are set to "11".

Further, the verify level "CV" is supplied to the select word line to execute a verify operation. As a result, a memory cell completing the verify operation is set to a non-write state. Specifically, in the period C shown in FIG. 5, data latch circuits 0DL and 1DL corresponding to write data "C" of the memory cell are set to "11".

If the verify operation is not completed due to insufficient write, the foregoing first to third write voltages are slightly stepped up, and then, the foregoing write operation is repeated. In FIG. 5, Vst denotes a step-up voltage. In this manner, the first to third write voltage is stepped up until write of all data "A", "B" and "C" is completed, and the write operation is repeated.

According to the first embodiment, the write operation corresponding to each of data "A", "B" and "C" is executed, and thereafter, a verify operation for these data is carried out. Therefore, the threshold voltage of data "A" and "B" lower than data "C" receive an influence of capacitance coupling from neighboring cells, and thereafter, verified. As a result, even if a higher threshold voltage is written in neighboring cells, the threshold voltage of the memory cell previously completing write is set to a target threshold voltage. This serves to properly set the potential difference between threshold voltage distributions corresponding to each data. Therefore, a read margin is sufficiently secured, and a read error is prevented.

Data such as data "C" having a higher threshold voltage is written in the program A and in the program B. Therefore, in the program C, threshold voltage shift is smoothly performed compared with the case where write is started first. As a result, the threshold voltage is converged to the target threshold voltage.

(Second Embodiment)

Figure 7:
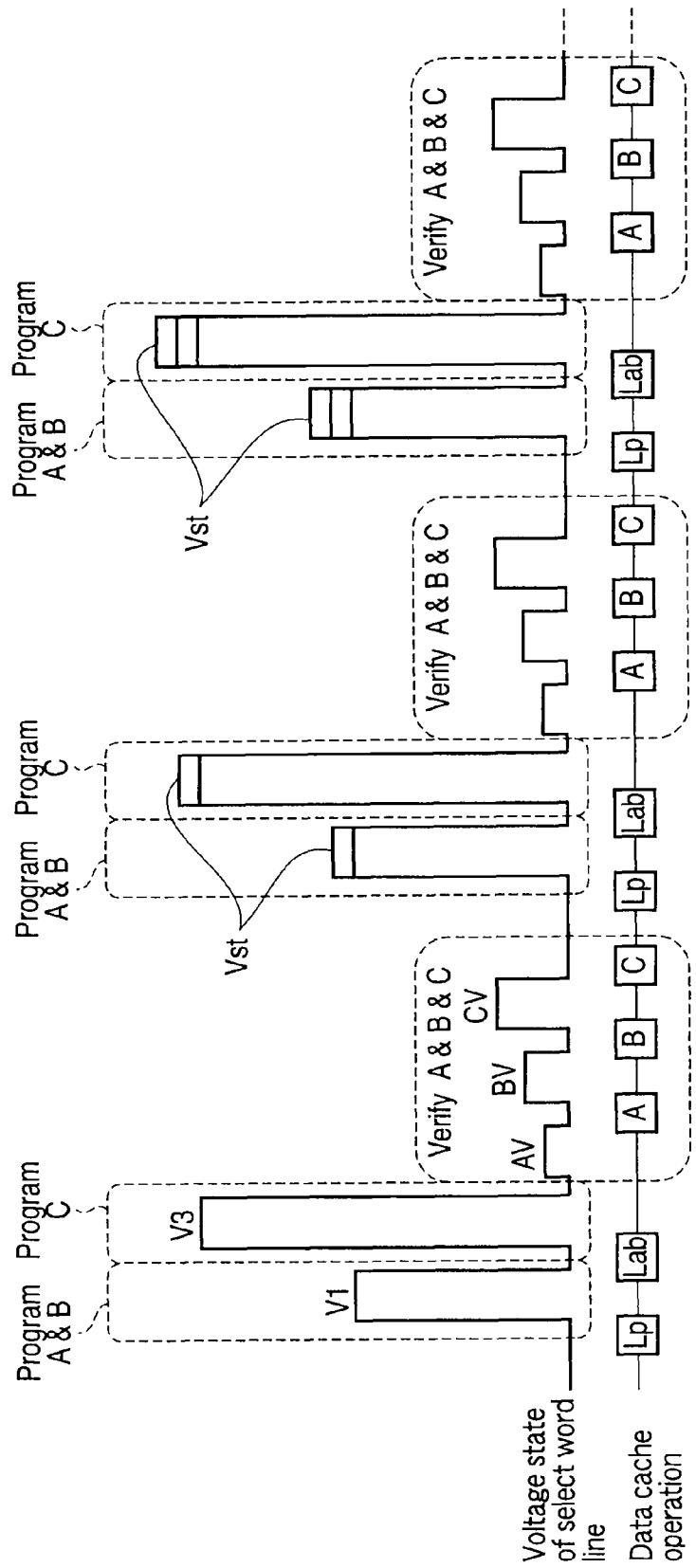
FIG. 7 is a view to explain a write operation according to a second embodiment.

FIG. 7 shows a second embodiment, and the same numerals are used to designate portions identical to FIG. 5. According to the first embodiment shown in FIG. 5, the first to third write voltages are applied to data "A", "B" and "C", respectively, and thus, a write operation is executed. However, the distance between threshold voltage distributions of data "A" and "B" is considerably close. For this reason, in the write operation shown in FIG. 5, when the write voltage is stepped up to repeat a write operation, the following problem arises. Namely, the stepped-up first write voltage of data "A" finally exceeds the initial level of the second write voltage of data "B"; for this reason, write efficiency is reduced.

In order to solve the foregoing problem, according to the second embodiment, write operations of data "A" and "B" are simultaneously executed as shown in FIG. 7, and thereafter, a write operation of data "C" is executed. In this case, in a period Lp, non-write data "Er" is set to a non-write state. Thereafter, in programs A and B, for example, a first voltage is applied to a select word line so that write of data "A" and "B" is simultaneously executed.

In a period Lab, data "Er", "A" and "B" are set to a non-write state. Thereafter, in the program C, a third write voltage is applied to the select word line, and then, a write operation of data "C" is executed.

A verify operation of data "A", "B" and "C" is executed using verify levels AV, BV and CV. As a result, if the verify operation is not completed, the first and third write voltages are stepped up. Thereafter, the write operation and the verify operation are repeated until verify is completed.

Figure 8:
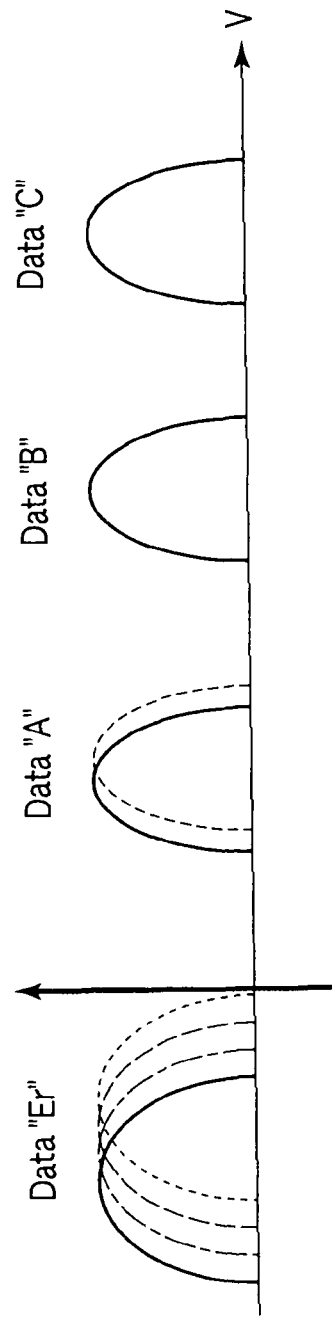
FIG. 8 is a view showing a threshold voltage distribution according to the write operation of the second embodiment.

FIG. 8 shows threshold voltage distribution when write is executed according a write method of the second embodiment. In this case, when data "B" is written in a memory cell adjacent to a memory cell in which data "A" is written, the threshold voltage corresponding to data "A" slightly shifts as shown by a broken line.

According to the second embodiment, the write operations of data "A" and "B" are simultaneously executed. Therefore, this serves to prevent a reduction of write speed, and it is possible to accurately set the threshold voltage distribution of each data because an influence of capacitance coupling of neighboring cells is eliminated.

(Third Embodiment)

Figure 9:
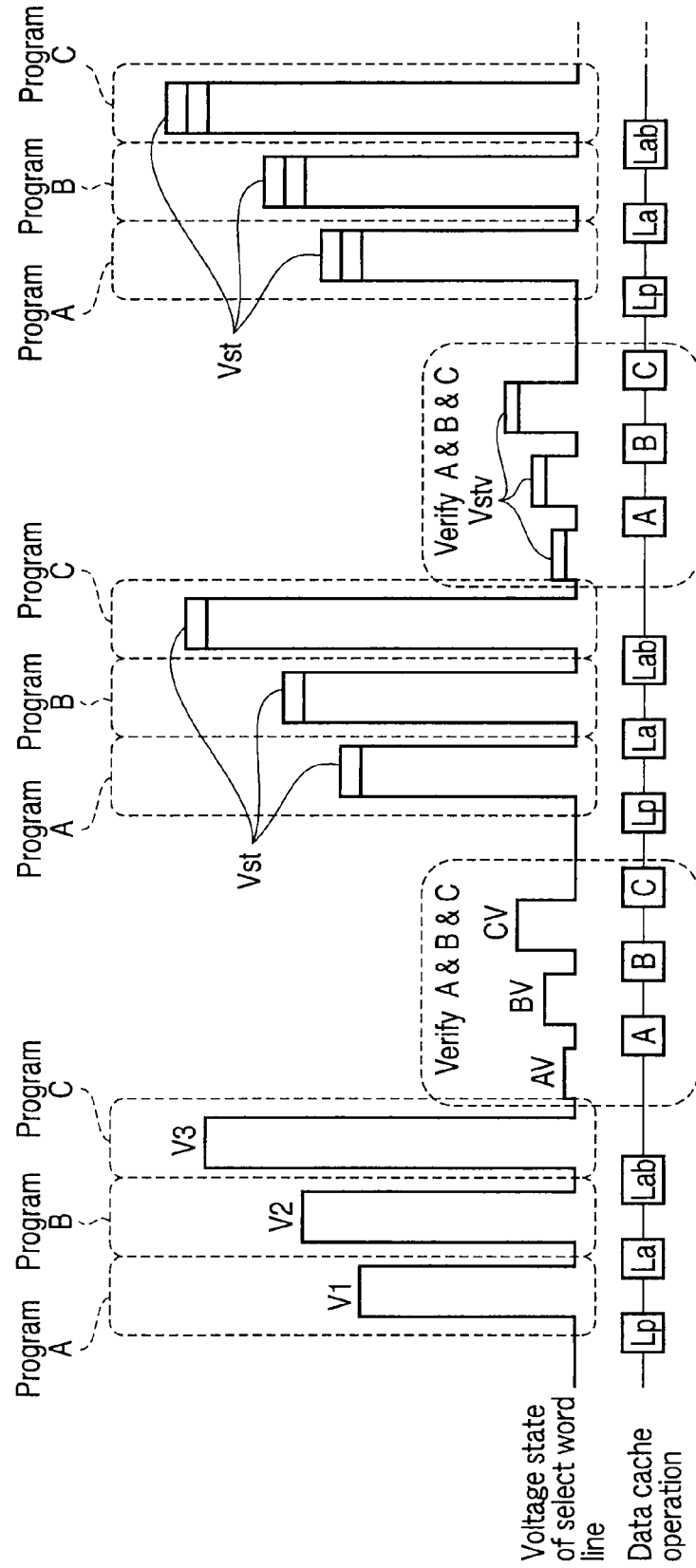
FIG. 9 is a view to explain a write operation according to a third embodiment.

FIG. 9 shows a third embodiment, and in FIG. 9, the same numerals are used to designate portions identical to the first and second embodiments. In the first and second embodiments, the verify levels "AV", "BV" and "CV" are set to a fixed voltage. Conversely, according to the third embodiment, the verify level is stepped up.

For example, a memory cell which passes a verify operation at the write initial stage is set to a non-write state. However, even if the memory cell is in a non-write state, the memory cell receives an influence of an operation of applying a write voltage later. For this reason, write is executed at a low threshold voltage using verify levels "AV", "BV" and "CV" in the write initial stage. Then, via write verify after that, verify levels "AV", "BV" and "CV" are stepped up. In FIG. 9, Vstv denotes a step-up voltage.

According to the third embodiment, the verify level is stepped up for each verify operation. For this reason, in a process that the threshold voltage of a memory cell steps up due to an operation of applying a write voltage, verify is executable considering the influence even if the following occurs. Namely, the threshold voltage steps up because of receiving an influence of capacitance coupling of neighboring memory cells and an influence of a write error. Therefore, it is possible to properly set the distance between threshold voltage distributions corresponding to each data, and to improve the data read margin.

(Fourth Embodiment)

Figure 10:
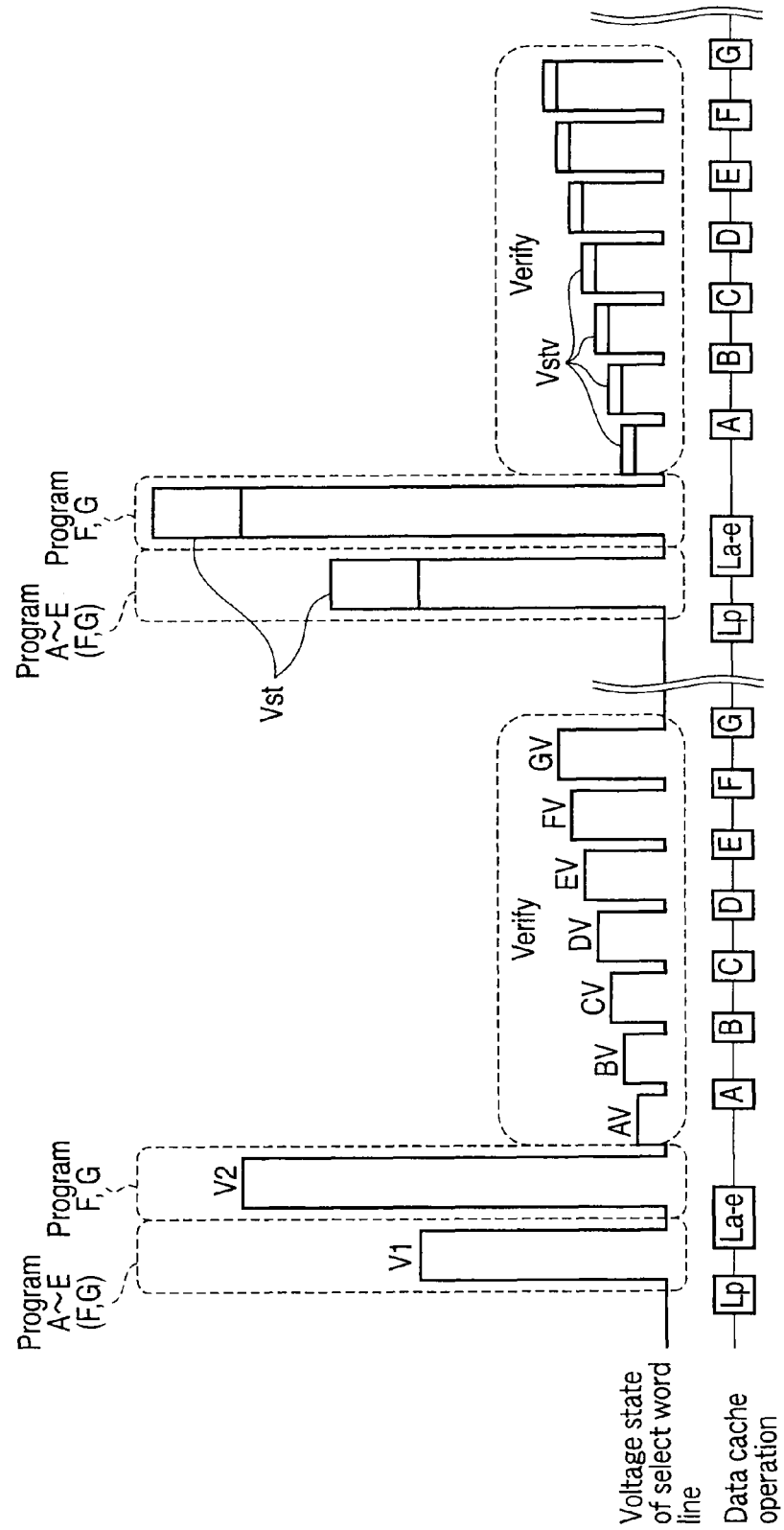
FIG. 10 is a view to explain a write operation according to a fourth embodiment.

FIG. 10 shows a fourth embodiment. According to the foregoing embodiments, a four-level two-bit write operation has been described. Conversely, according to the fourth embodiment of FIG. 10, an eight-level three-bit data write operation is shown. In this case, three-bit data is loaded in data latch circuits 0DL, 1DL and 2DL shown in FIG. 4. Three-bit data are assigned to data latch circuits 0DL, 1DL and 2DL as follows.

Data "Er": (0DL, 1DL, 2DL)=(1, 1, 1)
Data "A": (0DL, 1DL, 2DL)=(1, 1, 0)
Data "B": (0DL, 1DL, 2DL)=(1, 0, 1)
Data "C": (0DL, 1DL, 2DL)=(1, 0, 0)
Data "D": (0DL, 1DL, 2DL)=(0, 1, 1)
Data "E": (0DL, 1DL, 2DL)=(0, 1, 0)
Data "F": (0DL, 1DL, 2DL)=(0, 0, 1)
Data "G": (0DL, 1DL, 2DL)=(0, 0, 0)

In this case, the relationship of data "Er" to "G" is "Er"<"A"<"B"<"NC"<"D"<"E"<"F"<"G".

The write operation is executed in the following manner. First, in a period Lp shown in FIG. 10, an AND operation of data of data latch circuits 0DL, 1DL and 2DL is executed, and then, the data is set to the latch circuit LAT1 of the sense amplifier unit 3a shown in FIG. 3. As a result, in non-write, the node INV is set to "0", while in write, the node INV is set to "1".

Thereafter, in period programs A to E shown in FIG. 10, a first write voltage V1 is applied to a select word line. The first write voltage V1 is a voltage such that data "A" write is completed.

In a period La-e shown in FIG. 10, an OR operation of data of data latch circuits 0DL and 1DL is performed, and then, the data is set to the latch circuit LAT1 of the sense amplifier unit 3a. As a result, the node INV only of the latch circuit LAT1 corresponding to a memory cell writing data "F" and "G" is set to "1", showing write.

Thereafter, a second write voltage V2 is applied to a select word line, and then, a write operation is executed. The second write voltage V2 is a voltage such that data "F" write is completed.

Thereafter, as shown in FIG. 10, verify levels "AV" to "GV" are successively supplied to a select word line so that data "A" to "G" are verified. Each verify operation is executed; as a result, if verify is completed, data latch circuits 0DL, 1DL and 2DL corresponding to data "A" to "G" are set to ("1", "1", "1") in periods A to G, and thus, set as non-write data.

In a memory cell which does not complete write, data is set to the latch circuit LAT1 of the sense amplifier unit 3a in the same manner as described above. In this state, the first and second write voltages are stepped up, and then, a write operation is executed.

Thereafter, a verify operation is executed using verify levels "AV" to "GV" added with the step-up voltage Vstv.

The foregoing write operation and verify operation are repeated until verify is completed.

According to the fourth embodiment, eight-level three-bit data is written, and the same effect as the first to third embodiments is obtained.

(Modification Example)

Figure 11:
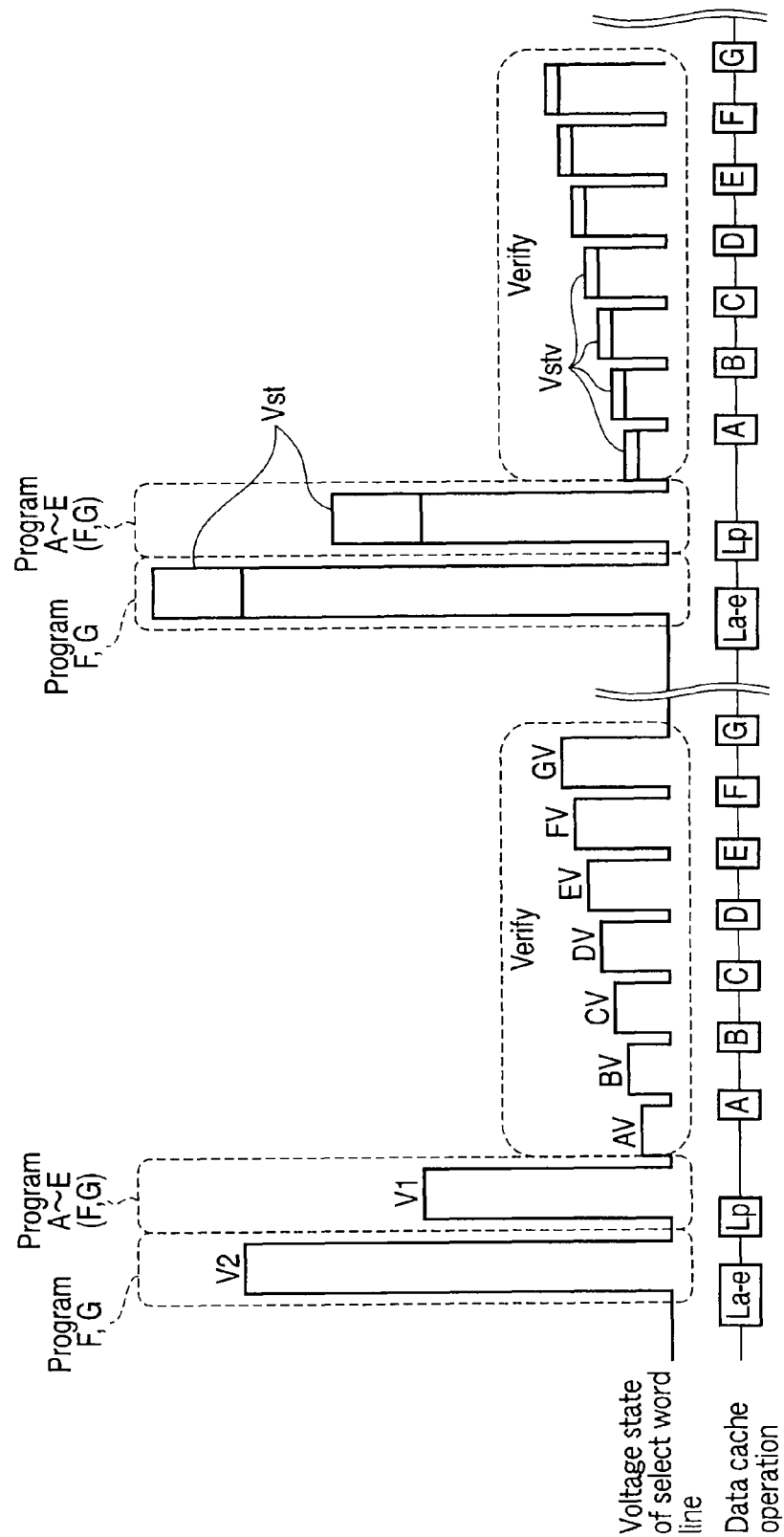
FIG. 11 is a view to explain a write operation according to a modification example of the fourth embodiment.

FIG. 11 shows a modification example of the fourth embodiment, and in FIG. 11, the same numerals are used to designate portions identical to FIG. 10.

According to the fourth embodiment, in the write operation, the first write voltage V1 is applied to a select word line to write data "A" to "E". Thereafter, the second write voltage V2 is applied to the select word line to write data "F" and "G".

Conversely, according to the modification example of FIG. 11, first, the second write voltage V2 is applied to the select word line to write data "F" and "G". Thereafter, the first write voltage V1 is applied to a select word line to write data "A" to "E". In this case, when data "F" and "G" are written, a memory cell in which data "A" to "E" are written is set to a non-write state. In a period shown by Lp, data "F" and "G" are set to a non-write state, and when data "A" to "E" are written, control is executed so that data "F" and "G" are not written.

According to the modification example, data "F" and "G" having a higher threshold voltage are previously written in the memory cell. Thereafter, data "A" to "E" having a threshold voltage lower than the voltage are written. Therefore, the threshold voltage of the previously written data "F" and "G" receives almost no influence of capacitance coupling due to write later. As a result, it is possible to properly set the distance between threshold voltage distributions corresponding to each data, and to improve the data read margin.

Figure 22:
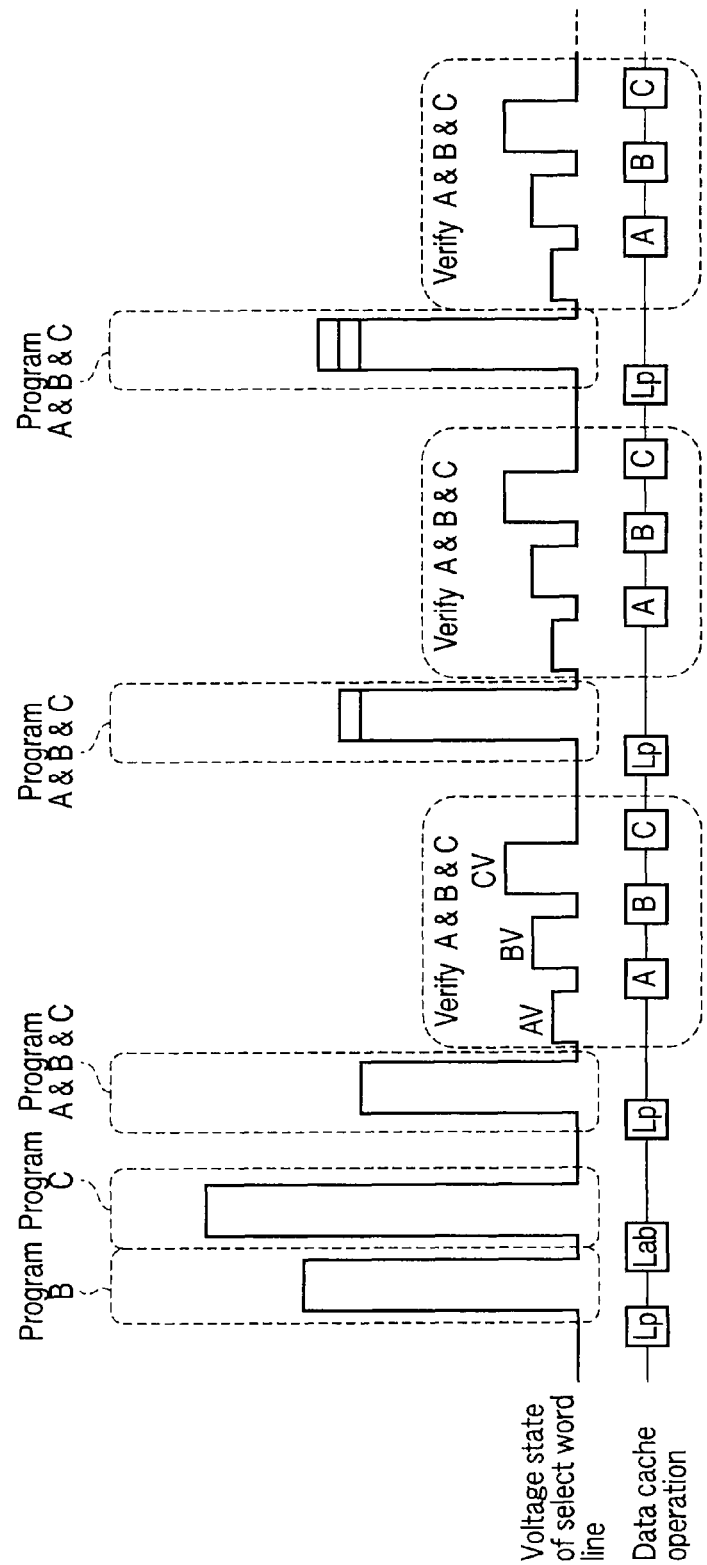
FIG. 22 is a view to explain a write operation according to a modification example of the first embodiment.

FIG. 22 shows a modification example of the first embodiment.

When data "B" or "C" is written in a memory cell adjacent to a memory cell in which data "A" is written, data "B" and "C" verify are completed after data "A" verify is completed. For this reason, the previously written data "A" receives an influence of capacitance coupling of neighboring cells.

In order to solve the foregoing problem, an operation shown in FIG. 22 is executed. Specifically, a voltage such that verify is not completed is applied to a memory cell in which data "B" or "C" is written, and then, a write operation is executed, and thereby, the threshold voltage steps up to some degree. In other words, the threshold voltage is set to a level lower than the target level. Thereafter, a simultaneous write operation of data "A", "B" and "C" and a verify operation using verify voltages "AV", BV" and "CV" are repeated. As described above, an influence of capacitance coupling is previously received, and thereby, it is possible to properly set the distance between threshold voltage distributions corresponding to each data, and to improve the data read margin.

(Application Examples)

Application examples to which the foregoing semiconductor memory device is applied will be described below.

FIG. 12 shows a memory card to which a semiconductor memory device is applied. In FIG. 12, a memory card 900 has a semiconductor memory device 901 including the NAND flash memory described in the foregoing embodiments. The semiconductor memory device 901 receives a predetermined control signal and data from an external device (not shown). The device 901 outputs a predetermined control signal and data to an external device (not shown).

Specifically, the semiconductor memory device 901 built in the memory card 900 is connected with the following signal lines. One is a signal line (DAT) transferring data, an address or command. Another is a command line enable signal line (CLE) showing that a command is transferred to the signal line DAT. Another is an address line enable signal line (ALE) showing that an address is transferred to the signal line DAT. Another is a ready/busy signal line (R/B showing whether or not a flash memory 10 is operable.

FIG. 13 shows another memory card. The memory card differs from the memory card shown in FIG. 12, and has a controller 910, which controls a flash memory 3 and exchanges a signal with an external device (not shown).

The controller 910 includes an interface (I/F) 911, an interface 912, a microprocessor (MPU) 913, a RAM 914 and an error checking correction unit (ECC) 915. Specifically, the interface (I/F) 911 inputs a signal from an external device (not sown) or outputs a signal to an external device. The interface 912 performs a signal exchange with one semiconductor memory device 901. The microprocessor (MPU) 913 executes a calculation for converting a logical address input from an external device to a physical address. The RAM 914 functions as a buffer for temporarily storing data. The error checking correction unit (ECC) 915 generates an error correction code. The interface 911 of the memory card 900 is connected with a command signal line (CMD), a clock signal line (CLK) and a signal line (DAT).

In the memory card, the number of various signal lines, the bit width of the signal line and the configuration of the controller are modifiable. The foregoing configuration is applied, and thereby, a solid state drive (SSD) is configured in place of a hard disk.

Figure 14:
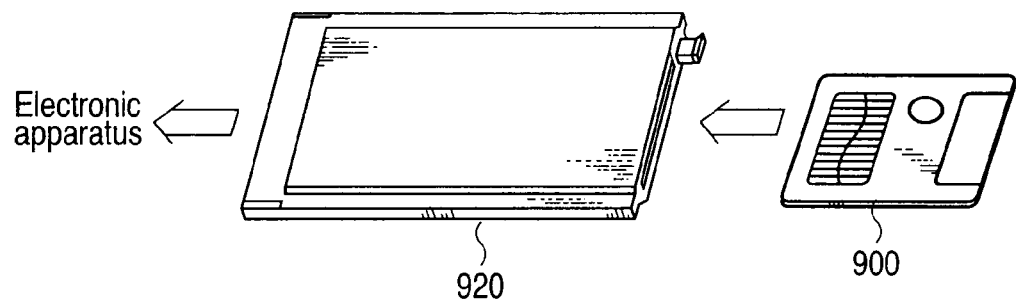

FIG. 14 shows another application example. As seen from FIG. 14, the foregoing memory card 900 is inserted to a card holder 920 to be connected to an electronic apparatus (not shown). The card holder 920 has a part of the function of the controller 910.

Figure 15:
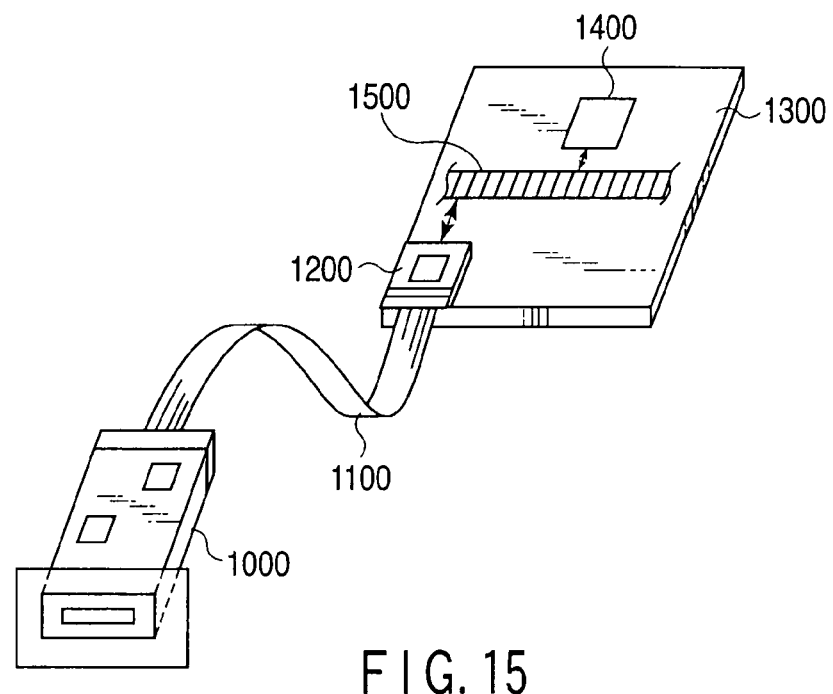

FIG. 15 shows another application example. The memory card 900 or the card holder 920 in which the memory card 900 is inserted is inserted to a connector 1000. The connector 1000 is connected to a board 1300 via a connection wire 1100 and an interface circuit 1200. The board 1300 has a built-in CPU 1400 and bus 1500.

Figure 16:
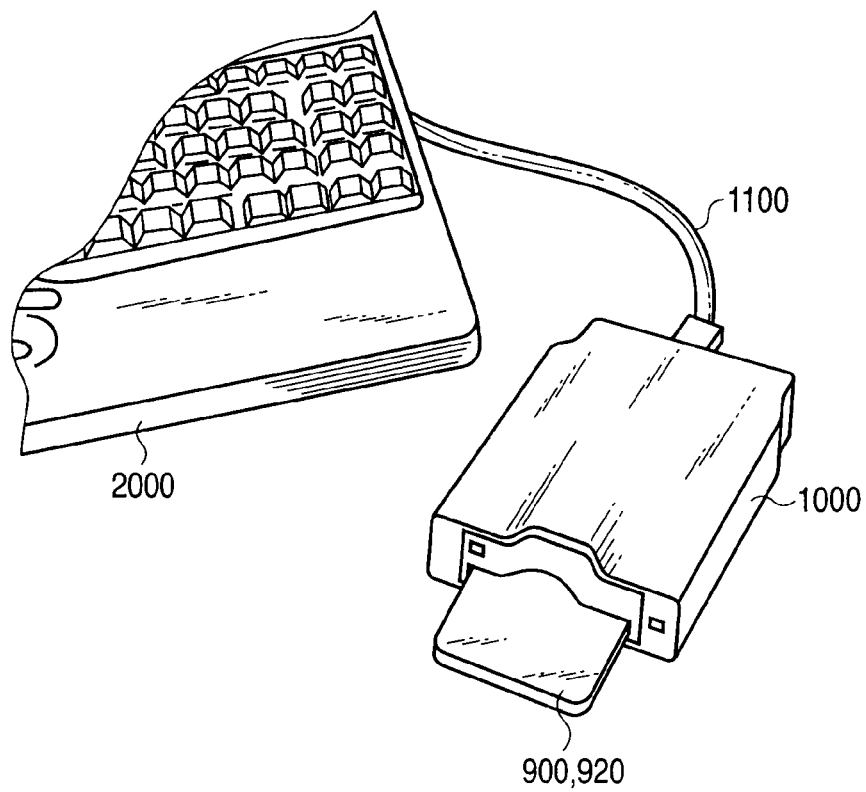

FIG. 16 shows another application example. The memory card 900 or the card holder 920 in which the memory card 900 is inserted is inserted to a connector 1000. The connector 1000 is connected to a personal computer 2000 via a connection wire 1100.

Figure 17:
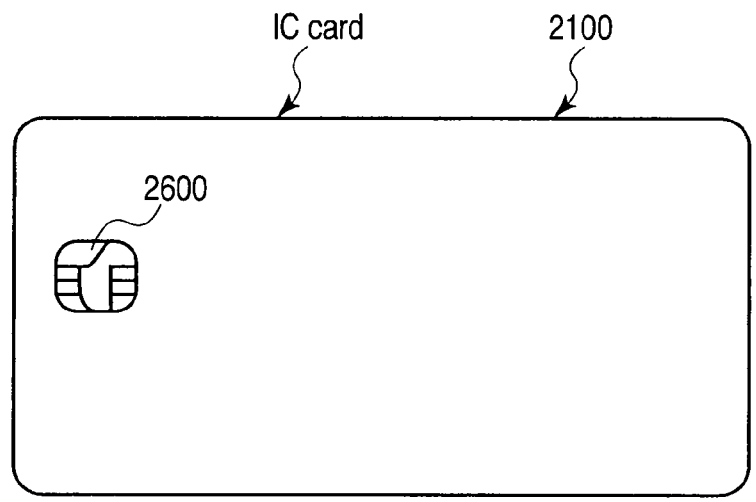
Figure 18:
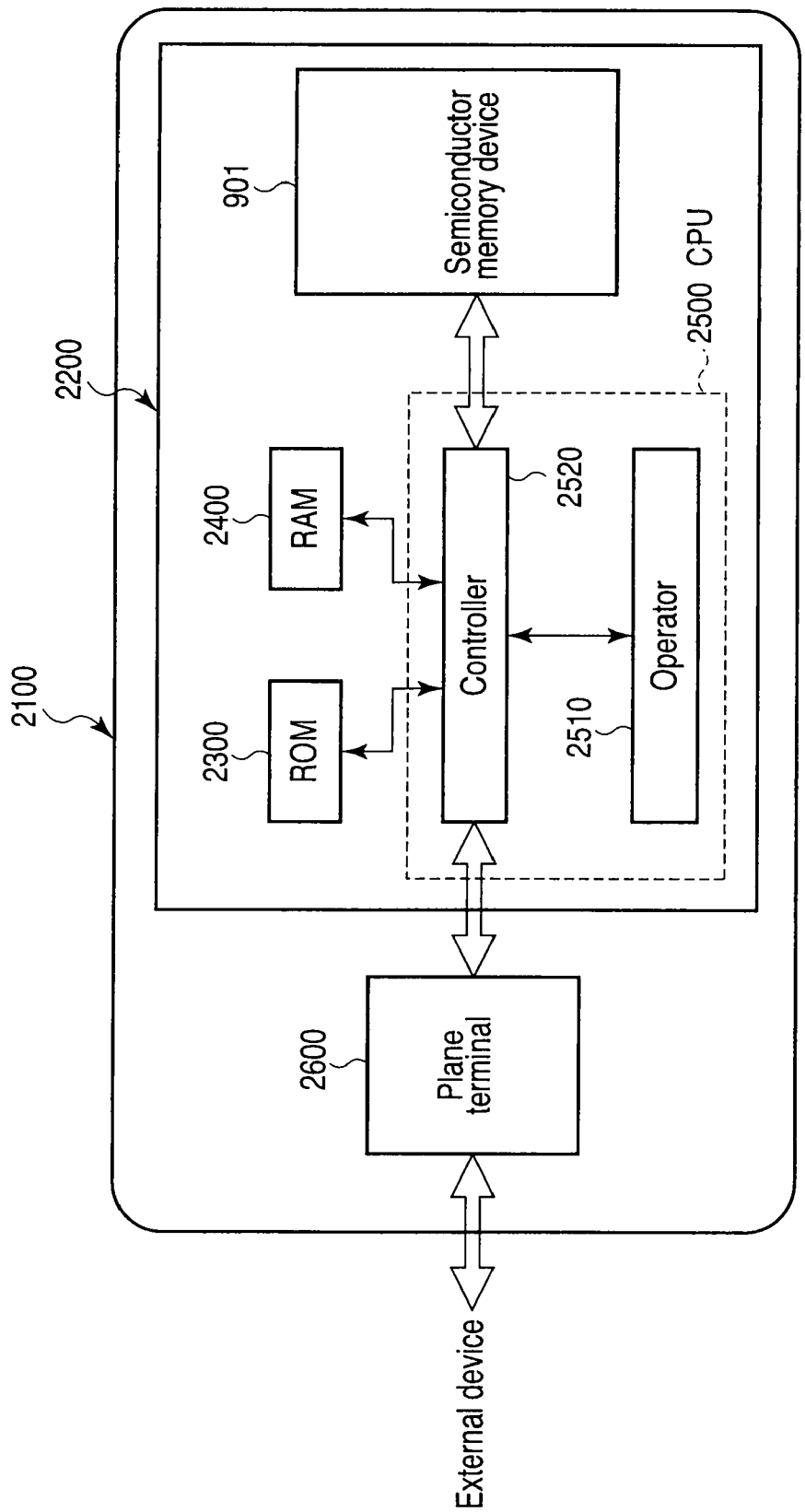

FIGS. 17 and 18 show another application example. As shown in FIGS. 17 and 18, an IC card 2100 has a built-in MCU 2200. The MCU 2200 includes a semiconductor memory device 901 including a NAND flash memory according to the foregoing embodiments, a ROM 2300, a RAM 2400 and a CPU 2500. As seen from FIG. 17, the IC card 2100 has a plane terminal 2600, which is partially exposed on the surface. The plane terminal 2600 is connected to the MCU 2200. The CPU 2500 includes an operator 2510 and a controller 2520 connected to a flash memory 3, a ROM 2300 and a RAM 2400.

Figure 19:
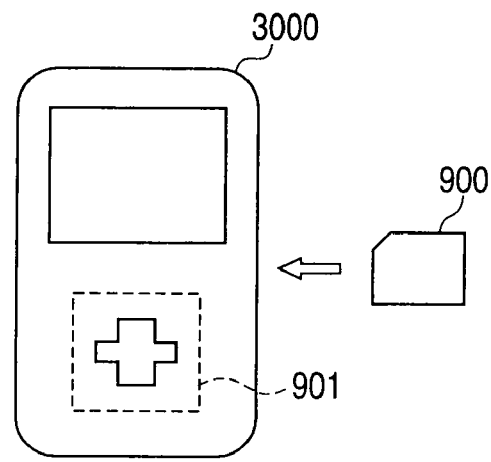

FIG. 19 shows another application example. For example, FIG. 19 shows a mobile music recording/reproducing apparatus 3000. The mobile music recording/reproducing apparatus 3000 has a built-in semiconductor memory device 901 including the NAND flash memory according to the foregoing embodiments. Further, a memory card 900 including the NAND flash memory is loadable.

Figure 20:
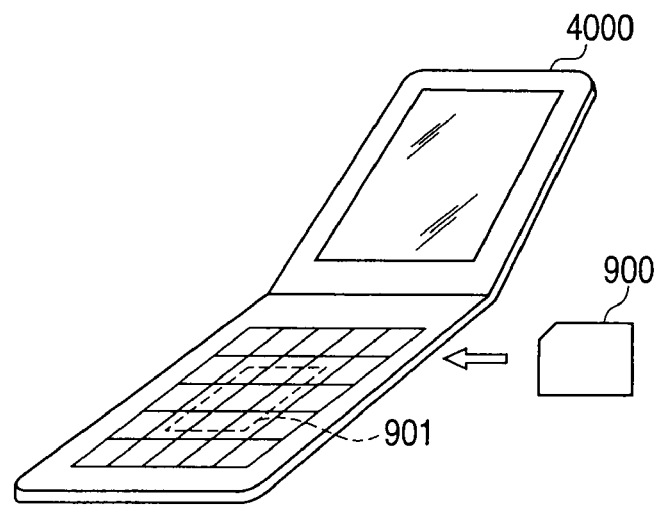

FIG. 20 shows another application example. For example, FIG. 20 shows a mobile terminal apparatus 4000 such as a mobile phone. The mobile terminal apparatus 4000 has a built-in semiconductor memory device 901 including the NAND flash memory according to the foregoing embodiments. Further, a memory card 900 including the NAND flash memory is loadable.

Figure 21:
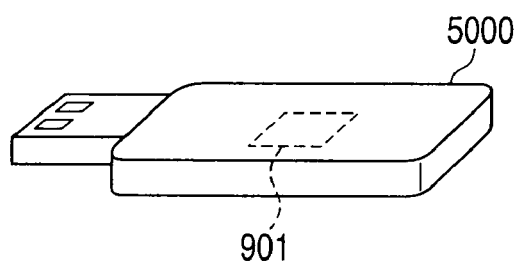

FIG. 21 shows another application example. For example, FIG. 21 shows a USB memory 5000. The USB memory 5000 has a built-in semiconductor memory device 901 including the NAND flash memory according to the foregoing embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array connected to a word line and a bit line, and configured so that a plurality of memory cells storing one level of n levels (n is a natural number of 4 or more) in one memory cell are arrayed in a matrix; and
    a control circuit configured to control a potential of the word line and the bit line in accordance with input data, and writing data in the memory cell,
    wherein the control circuit performs a operation which applies a write voltage corresponding to data written to the memory cell, for every write data, and wherein the control circuit executes a verify operation for each write data after a write voltage application operation ends with respect to all n levels or to data of a predetermined unit, and
    wherein the control circuit writes first and second write data (first write data<second write data) lower than a target level, and thereafter, simultaneously writes third write data (third write data<first write data) and the first and second write data, and executes a verify operation for each third, first and second write data after the write operation ends.

2. The device according to claim 1, wherein the control circuit simultaneously write n levels, and then, individually writes (n–k) levels.

3. The device according to claim 1, wherein the control circuit steps up a verify voltage in a verify operation compared with a verify voltage in a verify operation after the initial write voltage application operation in accordance with the number of write voltage application operations after that.

4. The device according to claim 1, wherein the control circuit sets a write voltage in a write operation after that lower than a write voltage in the initial write operation.

5. The device according to claim 1, wherein the control circuit simultaneously writes first and second write data (first write data>second write data), and thereafter, writes third write data (third write data>first write data), and further, executes a verify operation for each third, first and second write data after the write operation ends.

6. A write method used for a semiconductor memory device, comprising:

applying a write voltage corresponding to write data to a memory cell using a control circuit, the write voltage being different for each write data; and executing a verify operation for each write data after write voltage application ends with respect to all n levels (n is a natural number of 4 or more), and wherein the control circuit writes first and second write data (first write data<second write data) lower than a target level, and thereafter, simultaneously writes third write data (third write data<first write data) and the first and second write data, and executes a verify operation every third, first and second write data after the write operation ends.

7. The method according to claim 6, wherein the control circuit simultaneously write n levels, and then, individually writes (n−k) levels.

8. The method according to claim 6, wherein the control circuit steps up a verify voltage in a verify operation compared with a verify voltage in a verify operation after the initial write voltage application operation in accordance with the number of write voltage application operations after that.

9. The method according to claim 6, wherein the control circuit sets a write voltage in a write operation after that lower than a write voltage in the initial write operation.

10. The method according to claim 6, wherein the control circuit simultaneously writes first and second write data (first write data<second write data), and thereafter, writes third write data (third write data>first write data), and further, executes a verify operation every third, first and second write data after the write operation ends.

11. A memory card including the semiconductor memory device described in claim 1.

12. The memory card according to claim 11, further comprising:

a controller.

13. A card holder loaded with the memory card described in claim 12.

14. A mobile electronic apparatus including the semiconductor memory device described in claim 11.

15. A mobile electronic apparatus loaded with the memory card described in claim 12.

16. A USB memory including the semiconductor memory device described in claim 1.

17. The device according to claim 1, wherein the control circuit simultaneously writes k-level (k is a natural number less than 2 or more (n−1)) data, and individually writes remaining (n−k) levels).

18. The method according to claim 6, wherein the control circuit simultaneously writes k-level (k is a natural number less than 2 or more (n−1)) data, and individually writes remaining (n−k) levels).

19. The device according to claim 1, wherein the control circuit simultaneously writes 1-level to k-level (k is a natural number less than 2 or more (n−1)) data, and individually writes remaining (n−k) levels(1-level<2-level<. . . <k-level<. . . n-level).

20. The method according to claim 6, wherein the control circuit simultaneously writes 1-level to k-level (k is a natural number less than 2 or more (n−1)) data, and individually writes remaining (n−k) levels(1-level<2-level<. . . <k-level<. . . n-level).

* * * * *